(12) United States Patent
Nautiyal et al.

(10) Patent No.: US 7,035,132 B2
(45) Date of Patent: Apr. 25, 2006

(54) MEMORY ARCHITECTURE FOR INCREASED SPEED AND REDUCED POWER CONSUMPTION

(75) Inventors: Vivek Nautiyal, Uttaranchal (IN); Ashish Kumar, Jharkhand (IN)

(73) Assignee: STMicroelectronics Pvt. Ltd, Uttar Pradesh (IN)

( * ) Notice: Subject to any disclaimer, the term of this patent is extended or adjusted under 35 U.S.C. 154(b) by 0 days.

(21) Appl. No.: 10/426,004

(22) Filed: Apr. 29, 2003

(65) Prior Publication Data

US 2004/0022111 A1 Feb. 5, 2004

(30) Foreign Application Priority Data

Apr. 30, 2002 (IN) .......................... 509/DEL/2002

(51) Int. Cl.
*G11C 11/00* (2006.01)

(52) U.S. Cl. .......................... 365/154; 365/63; 365/156

(58) Field of Classification Search ................ 365/154, 365/156, 63, 230.02, 230.03, 230.04, 189.02
See application file for complete search history.

(56) References Cited

U.S. PATENT DOCUMENTS

| 5,519,655 | A | * | 5/1996 | Greenberg ............. 365/189.02 |
| 5,708,620 | A | * | 1/1998 | Jeong ........................... 365/63 |
| 5,828,594 | A | * | 10/1998 | Fujii ............................ 365/63 |
| 5,917,744 | A | * | 6/1999 | Kirihata et al. ............... 365/63 |
| 6,160,730 | A | | 12/2000 | Tooher | |

* cited by examiner

*Primary Examiner*—Gene N. Auduong
(74) *Attorney, Agent, or Firm*—Lisa K. Jorgenson; James H. Morris; Wolf, Greenfield & Sacks, P.C.

(57) ABSTRACT

An improved multi-wordline memory architecture providing decreased bitline coupling to increase speed and reduce power consumption including an interleaving arrangement for connecting adjacent bitcells to different wordlines, coupled to a multiplexing arrangement for sharing bitlines of adjacent bitcells.

25 Claims, 5 Drawing Sheets

*Figure: 1*

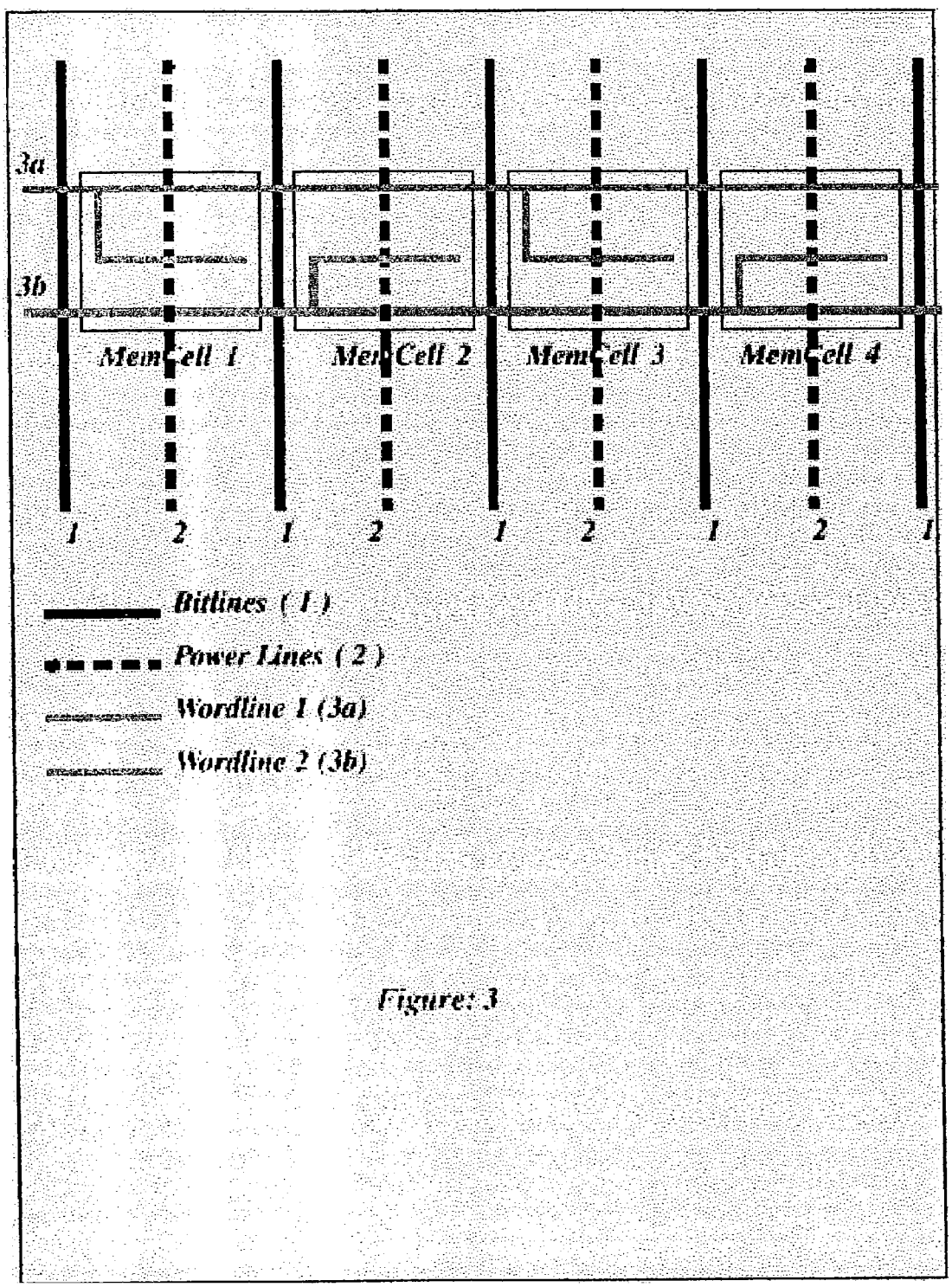
Figure: 3

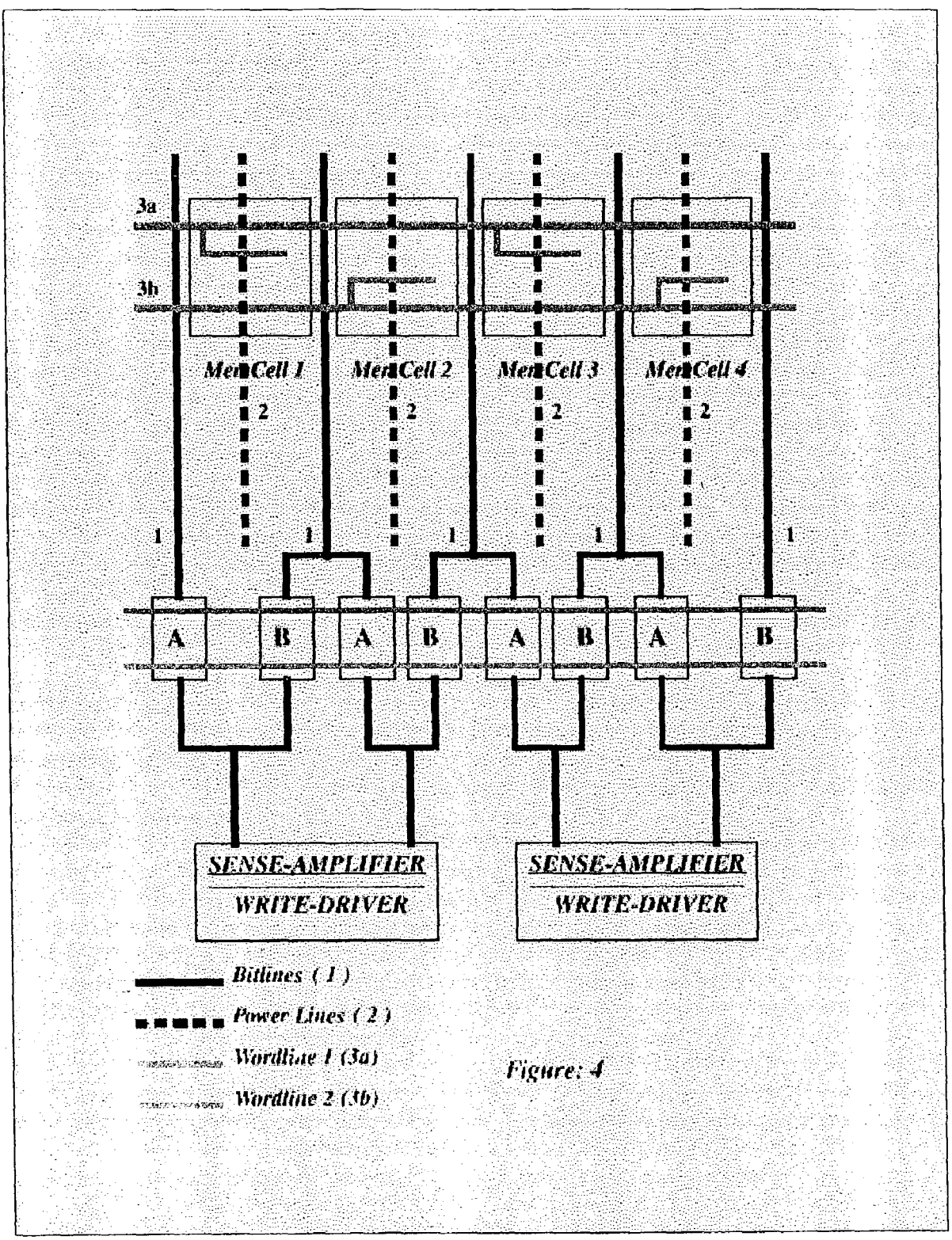
Figure: 4

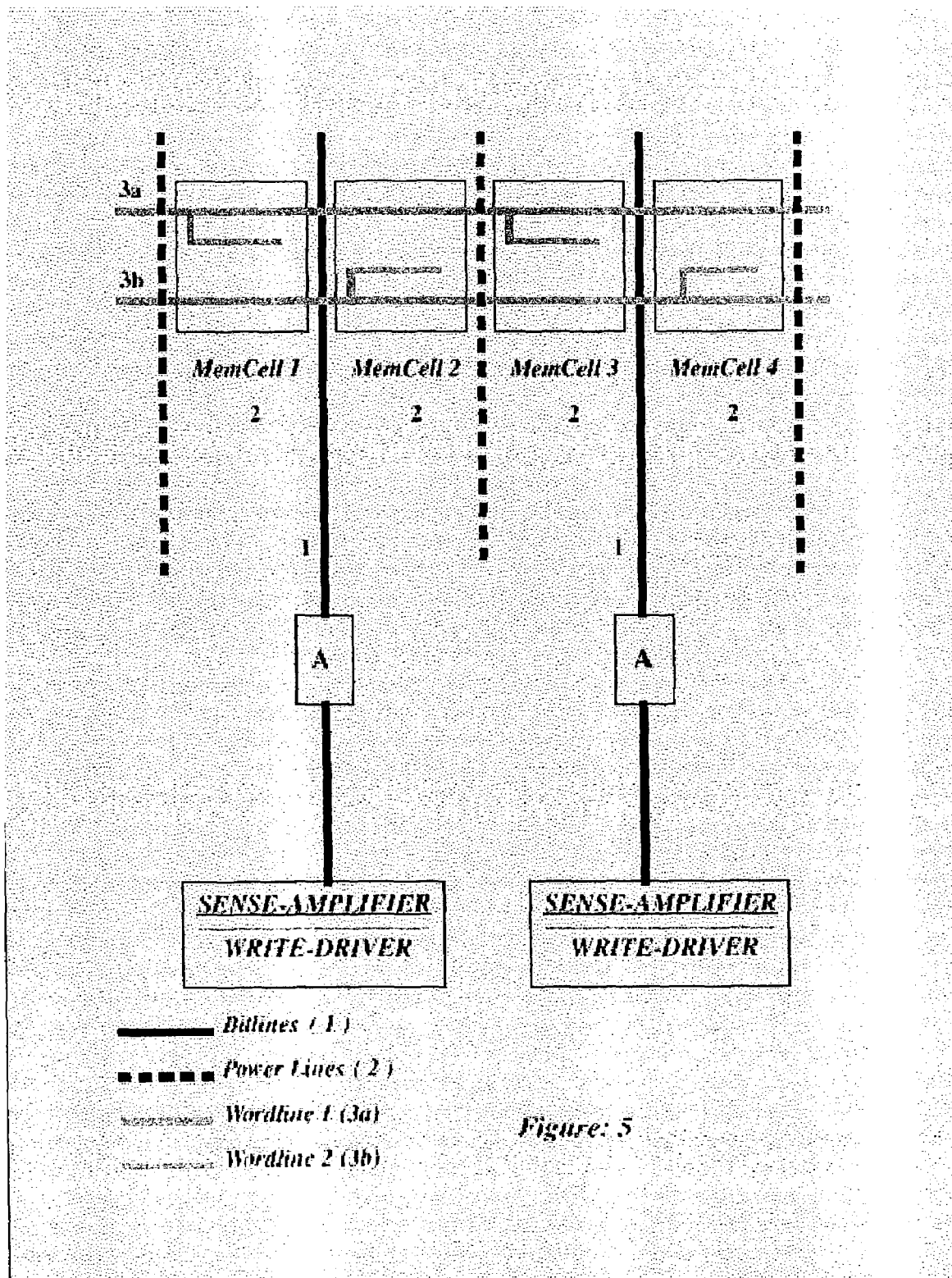
Figure: 5

MEMORY ARCHITECTURE FOR INCREASED SPEED AND REDUCED POWER CONSUMPTION

BACKGROUND OF THE INVENTION

1. Field of the Invention

This invention relates to an improved memory architecture that decreases bitline coupling to provide increased speed and reduced power consumption. The scheme is applicable to all types of memories using multiple wordlines.

2. Discussion of the Related Art

Memory architectures are continuously targeting higher operating speeds and increased densities. The increased densitites in turn impose additional requirements of reduced power dissipation. Several efforts have been made in addressing these requirements. One approach has been to introduce a stable voltage line, generally a power line, between adjacent bitlines so as to reduce the capacitive coupling between them thereby decreasing the capacitive loading resulting in increased speed and reduced power consumption. However, this technique increases the area required by each bitcell which conflicts with the requirement of increased bit densities.

U.S. Pat. No. 6,160,730 describes a memory architecture that uses interlaced multiple wordlines and provides a local selection line which crosses the word select line and connects to only one of the word select lines. While this invention does reduce bitcell area it does not address the issue of reducing capacitance to increase speed or reduce power consumption.

SUMMARY OF THE INVENTION

An object of this invention is to overcome at least the above drawbacks and provide a memory architecture that decreases bitline coupling to enable increased speed and reduced power dissipation.

This invention provides an improved memory architecture providing decreased bitline coupling to increase speed and reduce power consumption, comprising:

multiple wordlines each selecting a group of bitcells, using an interleaving arrangement for connecting adjacent bitcells to different wordlines, coupled to a multiplexing arrangement for sharing bitlines of adjacent bitcells.

The said interleaving arrangement is achieved by connecting select lines of adjacent bitcells to different word select lines.

The said multiplexing arrangement connects the bitline from each bitcell to a selected one of a plurality of sense/drive circuits based on the selected wordline.

Each bitcell includes an overlaid power line for decoupling adjacent bitcell lines in order to further reduce coupling capacitance.

Each bitcell connects to two complementary bitlines.

Each bitcell connects to a single bitline.

The present invention further provides an improved Static Random Access Memory (SRAM) architecture providing decreased bitline coupling to increase speed and reduce power consumption, comprising:

multiple wordlines each selecting a group of bitcells, using an interleaving arrangement for connecting adjacent bitcells to different wordlines, coupled to a multiplexing arrangement for sharing bitlines of adjacent bitcells.

The said interleaving arrangement is achieved by connecting select lines of adjacent bitcells to different word select lines.

The said multiplexing arrangement connects the bitline from each bitcell to a selected one of a plurality of sense/drive circuits based on the selected wordline.

Each bitcell includes an overlaid power line for decoupling adjacent bitcell lines in order to further reduce coupling capacitance.

Each bitcell connects to two complementary bitlines.

Each bitcell connects to a single bitline.

The instant invention also provides a method for improving memory architecture for decreasing bitline coupling to increase speed and reduce power consumption, comprising:

multiple wordlines each selecting a group of bitcells employing an interleaving arrangement for connecting adjacent bitcells to different wordlines, coupled to, multiplexing arrangement for sharing bitlines of adjacent bitcells.

The said interleaving arrangement is achieved by connecting select lines of adjacent bitcells to different word select lines.

The said multiplexing arrangement connects the bitline from each bitcell to a selected one of a plurality of sense/drive circuits based on the selected wordline.

Each bitcell includes an overlaid power line for decoupling adjacent bitcell lines in order to further reduce coupling capacitance.

Each bitcell connects to two complementary bitlines.

Each bitcell connects to a single bitline.

BRIEF DESCRIPTION OF THE ACCOMPANYING DRAWINGS

This invention will now be described with the help of the following drawings:

FIG. 3 shows the bitcell arrangement of a dual wordline memory structure having 2 bitlines per bitcell according to the present invention;

FIG. 4 shows the multiplexing arrangement of a dual wordline memory structure having 2 bitlines per bitcell according to the present invention; and FIG. 5 shows the bitcell arrangement of a dual wordline memory structure having 1 bitline per bitcell according to the present invention

DETAILED DESCRIPTION

Figure 1:
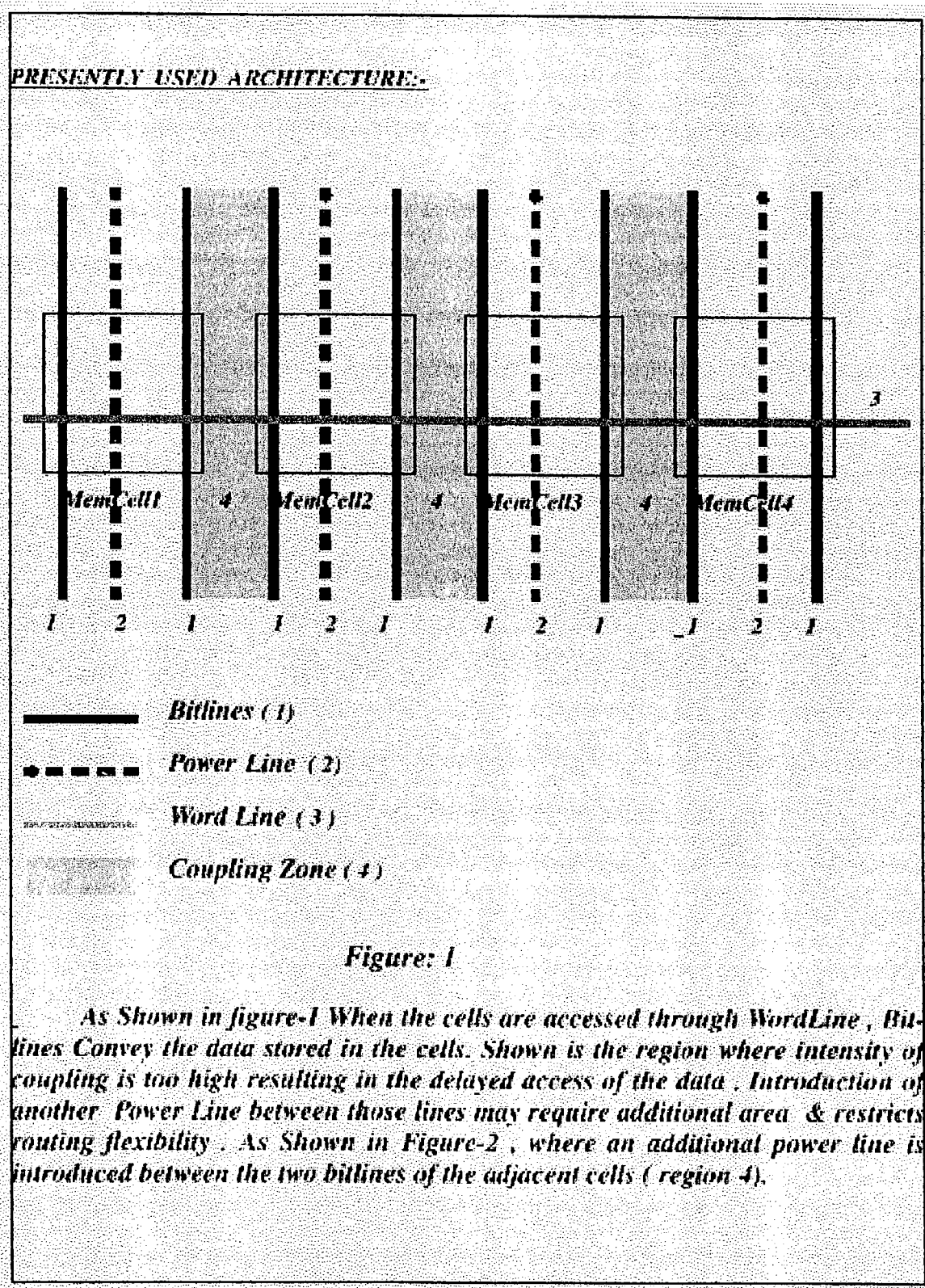
FIG. 1 shows a conventional single wordline memory structure.

FIG. 1 shows the bitcell arrangement for a single wordline bitcell according to the prior art. When the cells are accessed through the wordline the bitlines pair conveys the data and the complement of the data shared in the cells for a read operation, or the data and the complement of the data to be stored in the cell in the case of a write operation. The shaded area indentifies the area of high coupling between adjacent bitcells. This capacitance coupling increases power dissipation and delay time as the coupling capacitor is charged or discharged at each bitcell boundary on each access. For a case of "N" bitcells the number of bitlines is "2N" and the number of coupling capacitances to be charged or discharged is "N−1".

Figure 2:
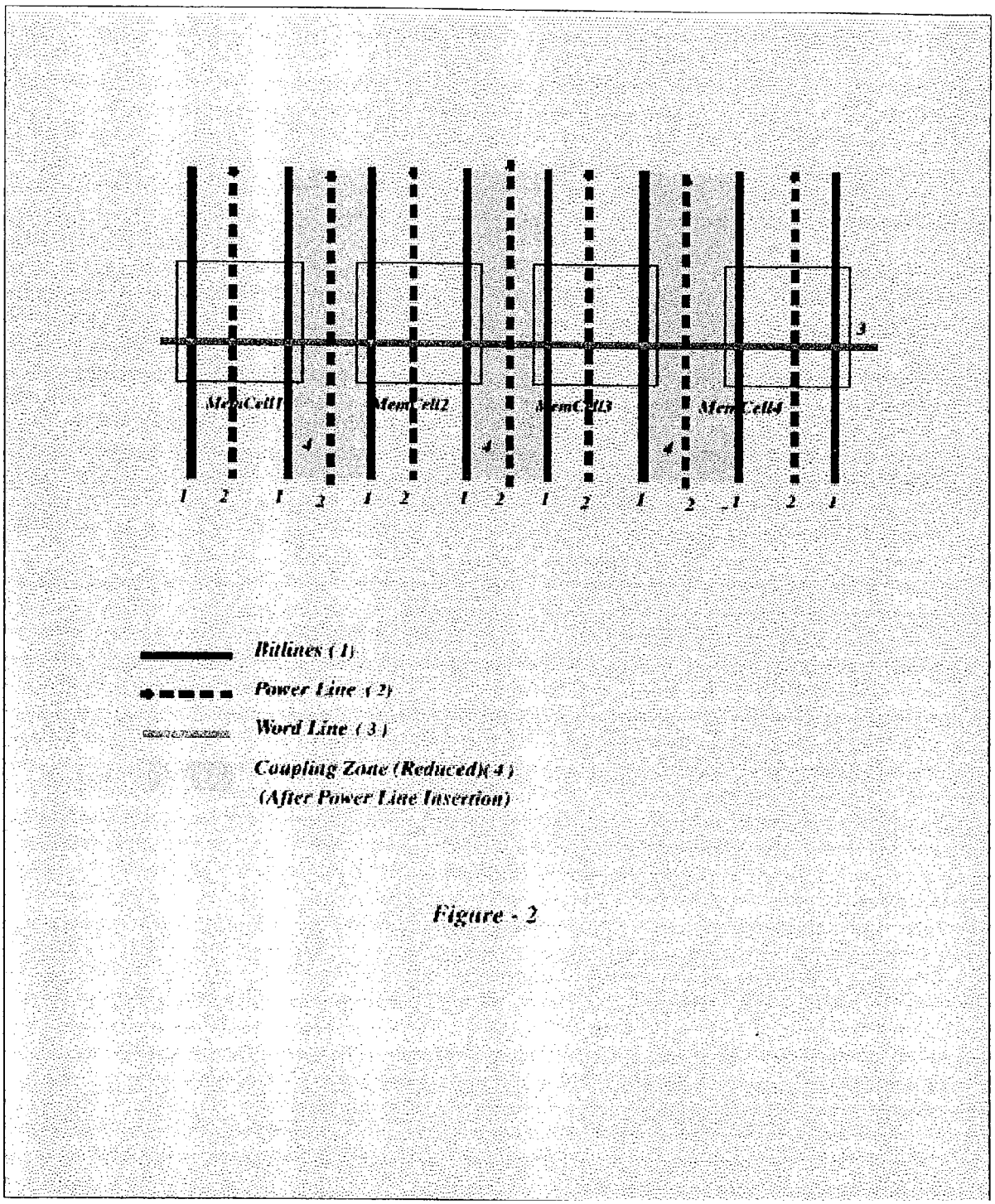
FIG. 2 shows a conventional single wordline architecture with a power line introduced between adjacent bitlines for reducing capacitive coupling.

FIG. 2 shows the addition of a decoupling signal line or "trace" between adjacent bitlines from adjacent bitcells. The decoupling trace is connected to a stable D.C. voltage, usually a power supply voltage, and acts to "shield" one bitline from the other. While this "shield" reduces the bitline coupling it increases the average effective area per bitcell.

The modified bitcell architecture according to the instant invention is shown in FIG. 3. The memory array is now organised as a dual wordline structure with adjacent bitcells connected to different word select lines. At the same time, the adjacent bitlines of 2 adjacent bitcells have been merged to form a common bitline. This structure reduces the number of bitlines to only "N+1" bitcells for every "N" bitcells. There is also no region of coupling between adjacent bitcells. When wordline 1 is selected bitcell 1 and bitcell 3 are accessed for read or write, while bitcell 2 and bitcell 4 are disabled. Similarly, when wordline 2 is active bitcell 2 and bitcell 4 are accessed for Read or Write while bitcell 1 and bitcell 3 are deselected. The reduction of bitlines reduces the effective area per bitcell and also reduces the power consumption very significantly as the total capacitive charge/discharge currents is reduced. The addition of the "decoupling" line across each bitcell shields adjacent bitlines and further reduces power consumption. It will be apparent to an ordinary person in the art that the arrangement can be easily extended to the case of multiple wordlines where the number of wordlines is greater than 2.

A preferred implementation of multiplexing arrangement required for the sharing bitlines in the present invention is shown in FIG. 4. Switch pairs "A" & "B" connect each bitline to either one of 2 bitcell sense amplifiers/write drivers. The multiplexer channel selection is controlled by the two wordselect lines. When wordline 1 is active the bitline is connected through swich "A" to the first of the 2 sense amplifier/write drivers in the pair. Similarly, when wordline 2 is selected the same bitline is connected through switch "B" to the second sense amplifier/write driver in the pair.

FIG. 5 shows an arrangement wherein each bitcell outputs or receives data using only one bitline which is shared between adjacent bitcells. In this configuration there are only N/2 bitlines and N/2 sense amplifier/write drivers per "N" bitcells. Also only one switch is necessary for each bitcell pair resulting in a requirement of only "N/2" switches.

It will be apparent to those with ordinary skill in the art that the foregoing is merely illustrative and is not intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

What is claimed is:

1. An improved memory architecture providing decreased bitline coupling to increase speed and reduce power consumption, comprising:
multiple wordline each selecting a group of bitcells, using an interleaving arrangement for connecting adjacent bitcells to different wordlines, coupled to a multiplexing arrangement for sharing bitlines of adjacent bitcells in different columns of bitcells;
wherein each bitline is coupled to a first column of bitcells and an adjacent second column of bitcells, the first column being crossed by a first wordline that is coupled to a bitcell in the second column.

2. An improved memory architecture as claimed in claim 1 wherein said interleaving arrangement is achieved by connecting select lines of adjacent bitcells to different word select lines.

3. An improved memory architecture as claimed in claim 1 wherein said multiplexing arrangement connects the bitline from each bitcell to a selected one of a plurality of sense/drive circuits based on the selected wordline.

4. An improved memory architecture as claimed in claim 1 wherein each bitcell includes an overlaid power line for decoupling adjacent bitcell lines in order to further reduce coupling capacitance.

5. An improved memory architecture as claimed in claim 1 wherein each bitcell connects to two complementary bitlines.

6. An improved multi-wordline memory architecture as claimed in claim 1 wherein each bitcell connects to a single bitline.

7. An improved Static Random Access Memory (SRAM) architecture providing decreased bitline coupling to increase speed and reduce power consumption, comprising:
multiple wordlines each selecting a group of bitcells, using an interleaving arrangement for connecting adjacent bitcells to different wordlines, coupled to a multiplexing arrangement for sharing bitlines of adjacent bitcells in different columns of bitcells;
wherein each bitline is coupled to a first column of bitcells and an adjacent second column of bitcells, the first column being crossed by a first wordline that is coupled to a bitcell in the second column.

8. An improved SRAM architecture as claimed in claim 7 wherein said interleaving arrangement is achieved by connecting select lines of adjacent bitcells to different word select lines.

9. An improved SRAM architecture as claimed in claim 7 wherein said multiplexing arrangement connects the bitline from each bitcell to a selected one of a plurality of sense/drive circuits based on the selected wordline.

10. An improved SRAM architecture as claimed in claim 7 wherein each bitcell includes an overlaid power line for decoupling adjacent bitcell lines in order to further reduce coupling capacitance.

11. An improved SRAM architecture as claimed in claim 7 wherein each bitcell connects to two complementary bitlines.

12. An improved SRAM architecture as claimed in claim 7 wherein each bitcell connects to a single bitline.

13. A method for improving memory architecture for decreasing bitline coupling to increase speed and reduce power consumption, comprising:
multiple wordlines each selecting a group of bitcells employing an interleaving arrangement for connecting adjacent bitcells to different wordlines, coupled to multiplexing arrangement for sharing bitlines of adjacent bitcells in different columns of bitcells;
wherein each bitline is coupled to a first column of bitcells and an adjacent second column of bitcells, the first column being crossed by a first wordline that is coupled to a bitcell in the second column.

14. A method as claimed in claim 13 wherien said interleaving arrangement is achieved by connecting select lines of adjacent bitcells to different word select lines.

15. A method as claimed in claim 13 wherein said multiplexing arrangement connects the bitline from each bitcell to a selected one of a plurality of sense/drive circuits based on the selected wordline.

16. A method as claimed in claim 13 wherein each bitcell includes an overlaid power line for decoupling adjacent bitcell lines in order to further reduce coupling capacitance.

17. A method as claimed in claim 13 wherein each bitcell connects to two complementary bitlines.

18. A method as claimed in claim 13 wherein each bitcell connects to a single bitline.

19. A memory architecture comprising:
a plurality of bitcells arranged in a plurality of rows and a plurality of columns;

a first wordline coupled to a first set of bitcells in a first row of bitcells and a second wordline coupled to a second set of bitcells in the first row of bitcells; and a plurality of bitlines, each bitline being coupled to a first plurality of bitcells in a first column of bitcells and an adjacent second plurality of bitcells in a second column of bitcells, wherein the first wordline crosses the first column and is coupled to at least one of the second plurality of bitcells in the second column.

20. The memory architecture of claim 19 wherein the first wordline controls a first switch that couples the bitline to a first sense amplifier/write driver when the first wordline is selected.

21. The memory architecture of claim 20 wherein the second wordline controls a second switch that couples the bitline to a second sense amplifier/write driver when the second wordline is selected.

22. The memory architecture of claim 21, wherein the memory architecture comprises N bitcells and no greater than approximately N+1 bitlines.

23. The memory architecture of claim 19, wherein the memory architecture comprises N bitcells and no greater than approximately N/2 bitlines.

24. The method of claim 17, wherein the memory architecture comprises N bitcells and no greater than approximately N+1 bitlines.

25. The method of claim 18, wherein the memory architecture comprises N bitcells and no greater than approximately N/2 bitlines.

* * * * *